United States Patent [19]
Chang et al.

[11] Patent Number: 5,249,151
[45] Date of Patent: Sep. 28, 1993

[54] MULTI-BODY MECHANICAL SYSTEM ANALYSIS APPARATUS AND METHOD

[75] Inventors: Yi-Chung Chang, Sunnyvale; Ting-Hong K. Chung, Cupertino; James L. Wiederrich, Lodi, all of Calif.

[73] Assignee: FMC Corporation, Chicago, Ill.

[21] Appl. No.: 990,351

[22] Filed: Dec. 15, 1992

Related U.S. Application Data

[63] Continuation of Ser. No. 534,105, Jun. 5, 1990, abandoned.

[51] Int. Cl.$^5$ ............................................. G06F 15/20
[52] U.S. Cl. .................................. 364/578; 364/474.24
[58] Field of Search ................ 364/578, 474.24, 565, 364/566, 579; 395/919, 920

[56] References Cited

U.S. PATENT DOCUMENTS

| | | | |
|---|---|---|---|
| 4,736,306 | 4/1988 | Christonsen et al. | 364/474.24 |
| 5,014,230 | 5/1991 | Sinha et al. | 364/578 |
| 5,043,929 | 8/1991 | Kramer et al. | 364/578 |

OTHER PUBLICATIONS

Paper authored by T. R. Kane from Journal of Applied Mechanics dated Sep. 1988, vol. 55/711 describes a method for formulating the equations governing the motions of mechanical systems.

*Primary Examiner*—Jack B. Harvey
*Assistant Examiner*—Ellis B. Ramirez
*Attorney, Agent, or Firm*—H. M. Stanley; R. C. Kamp; R. B. Megley

[57] ABSTRACT

A system is disclosed which functions in two distinct yet interrelated modes. In a modeling mode the system provides a customized multi-body model, wherein problem specific functions are created for analysis of complex real-world machines. A preprocessor facilitates the multi-body model description and a symbolic generator then generates model specific code in FORTRAN of some other convenient computer language. The model code is portable and self contained. In a numerical simulation mode actual multi-body system data are combined with the model code, whereby the system is manageable by a user not necessarily familiar with the modeling techniques, but familiar with the multi-body system modeled. Simulation operations by the system produce outputs descriptive of the multi-body system without redundancy, which outputs may then be utilized by the user through a post processor to compute further quantities of interest and to apply visualization to interpret results.

31 Claims, 7 Drawing Sheets

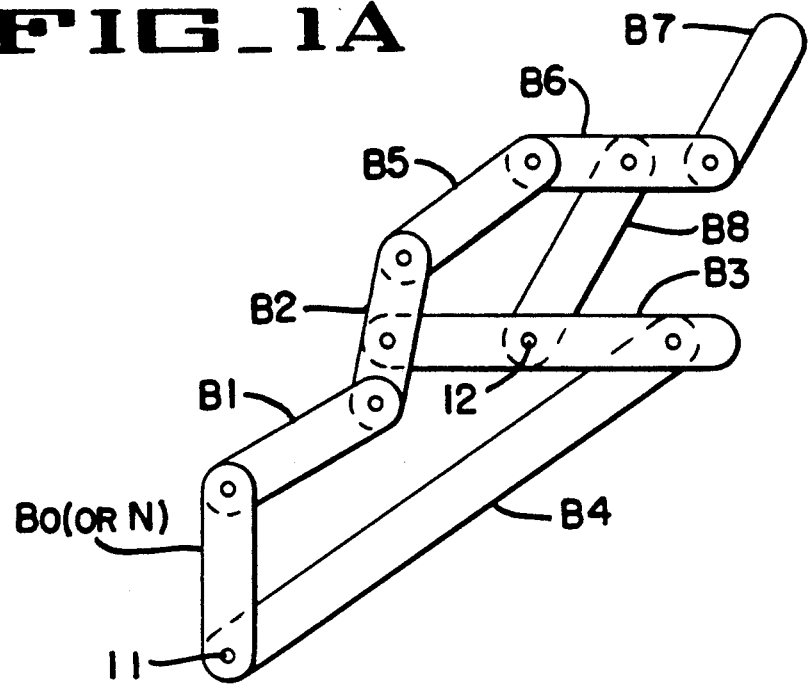
FIG_1A
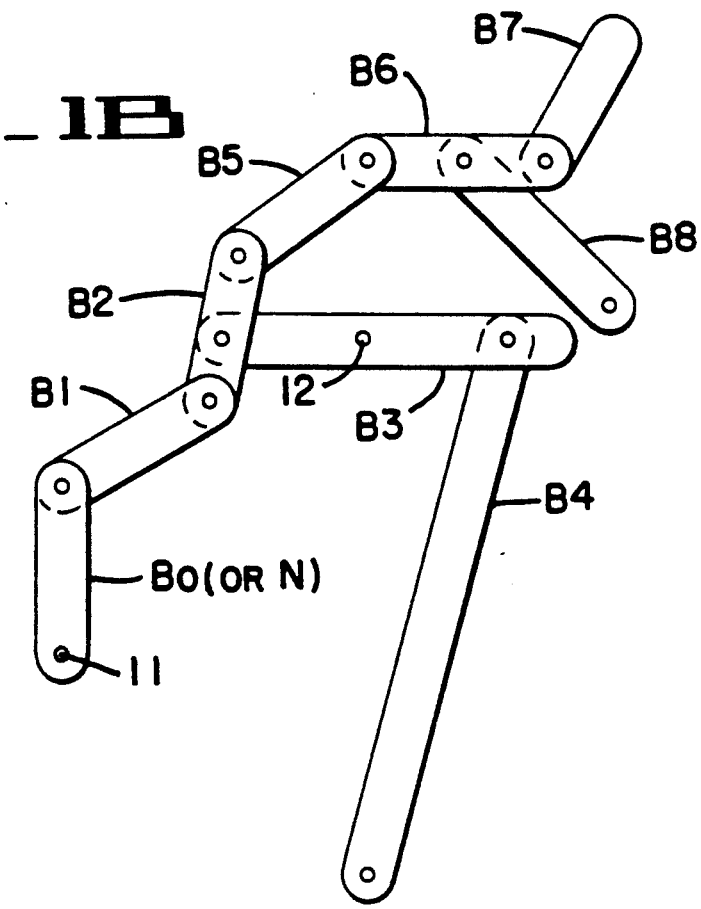
FIG_1B

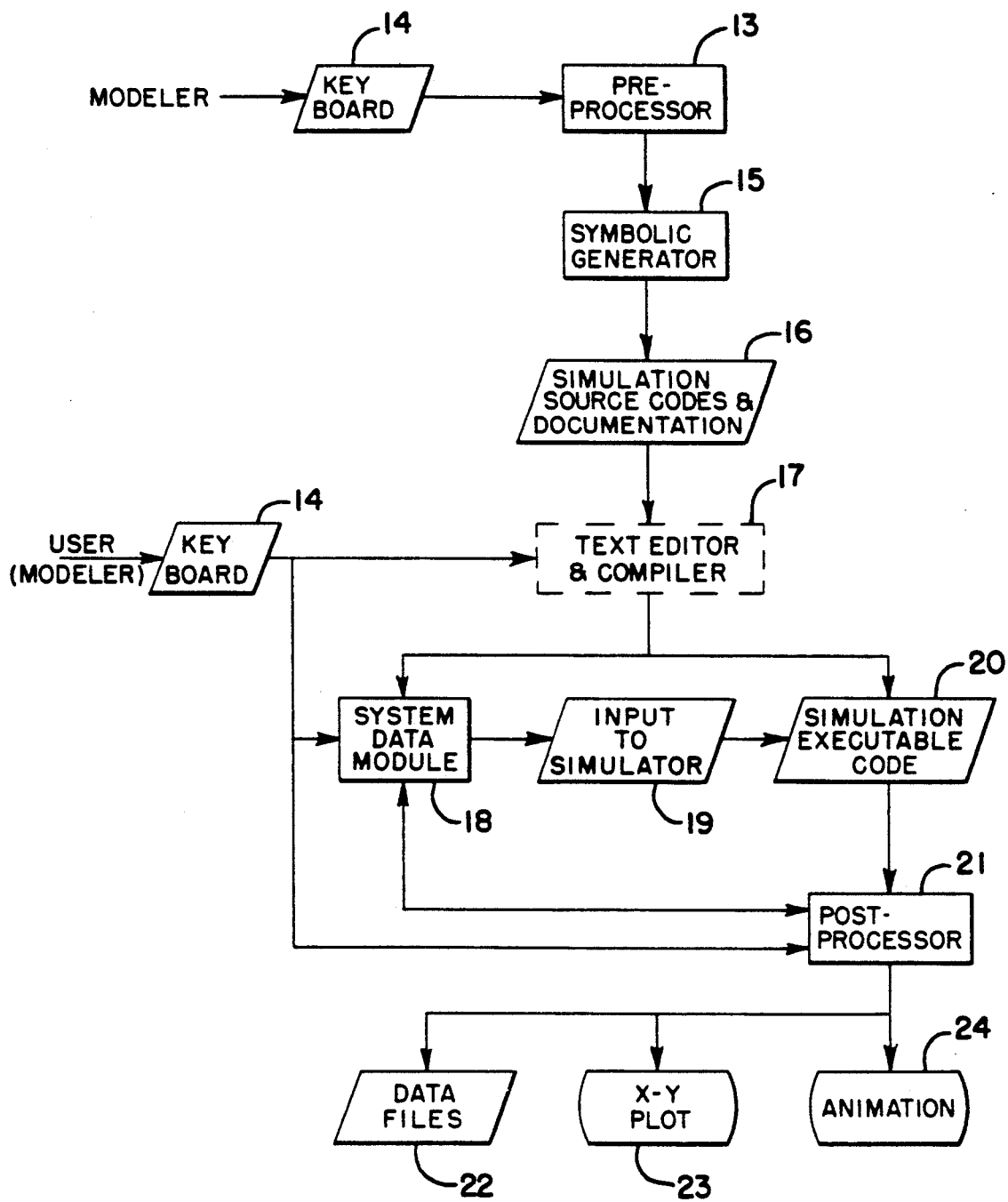

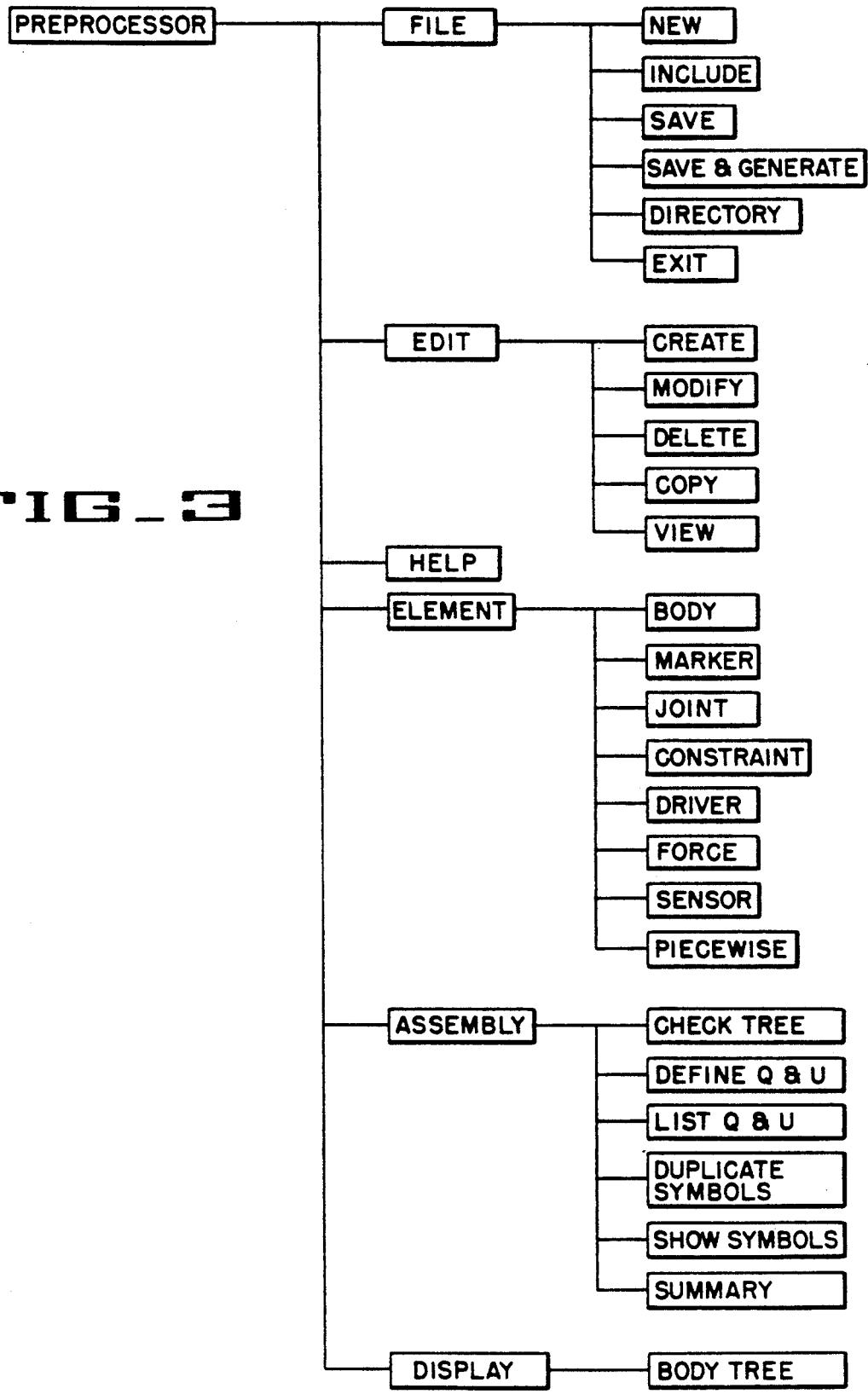
FIG_3

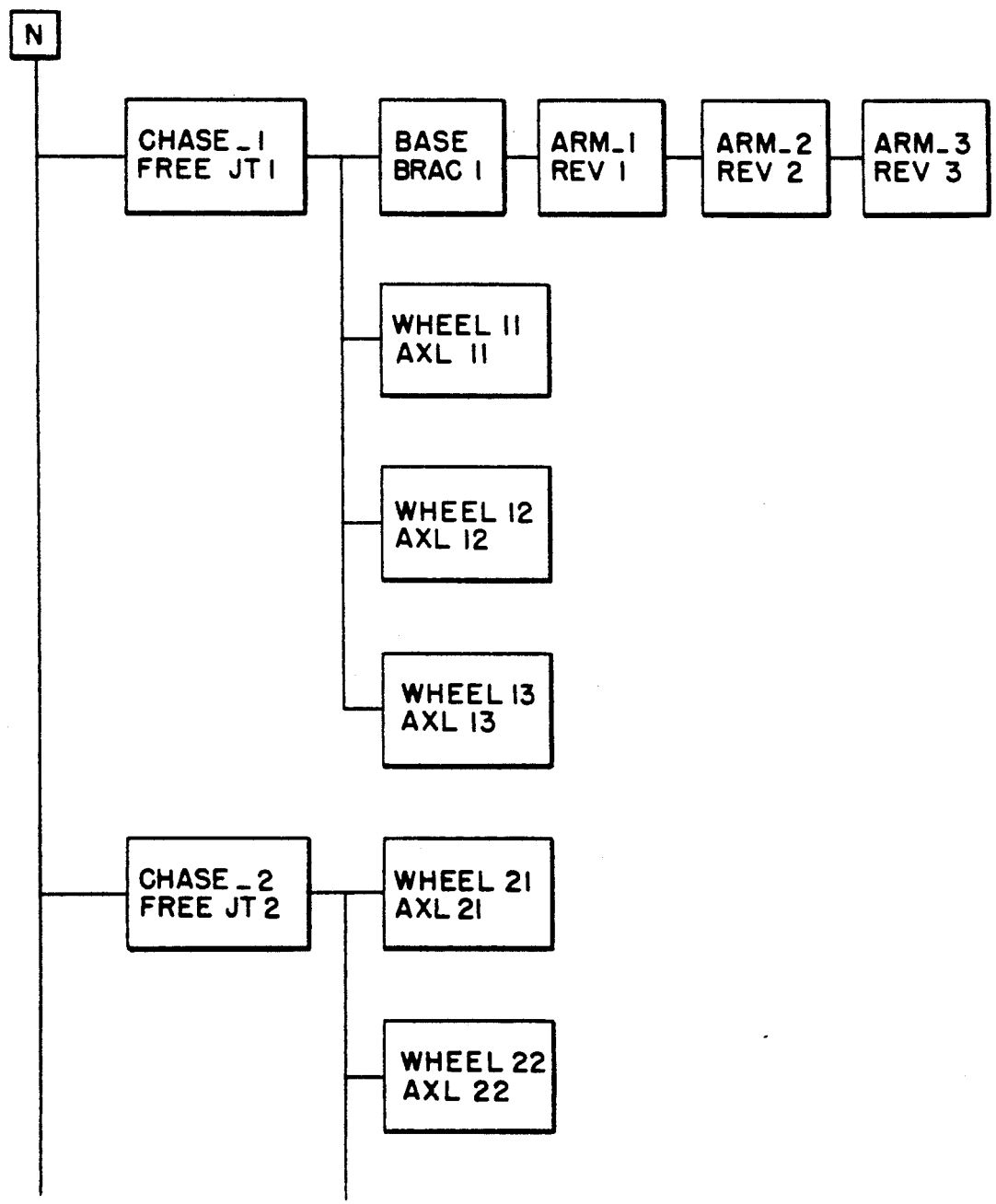
FIG_4

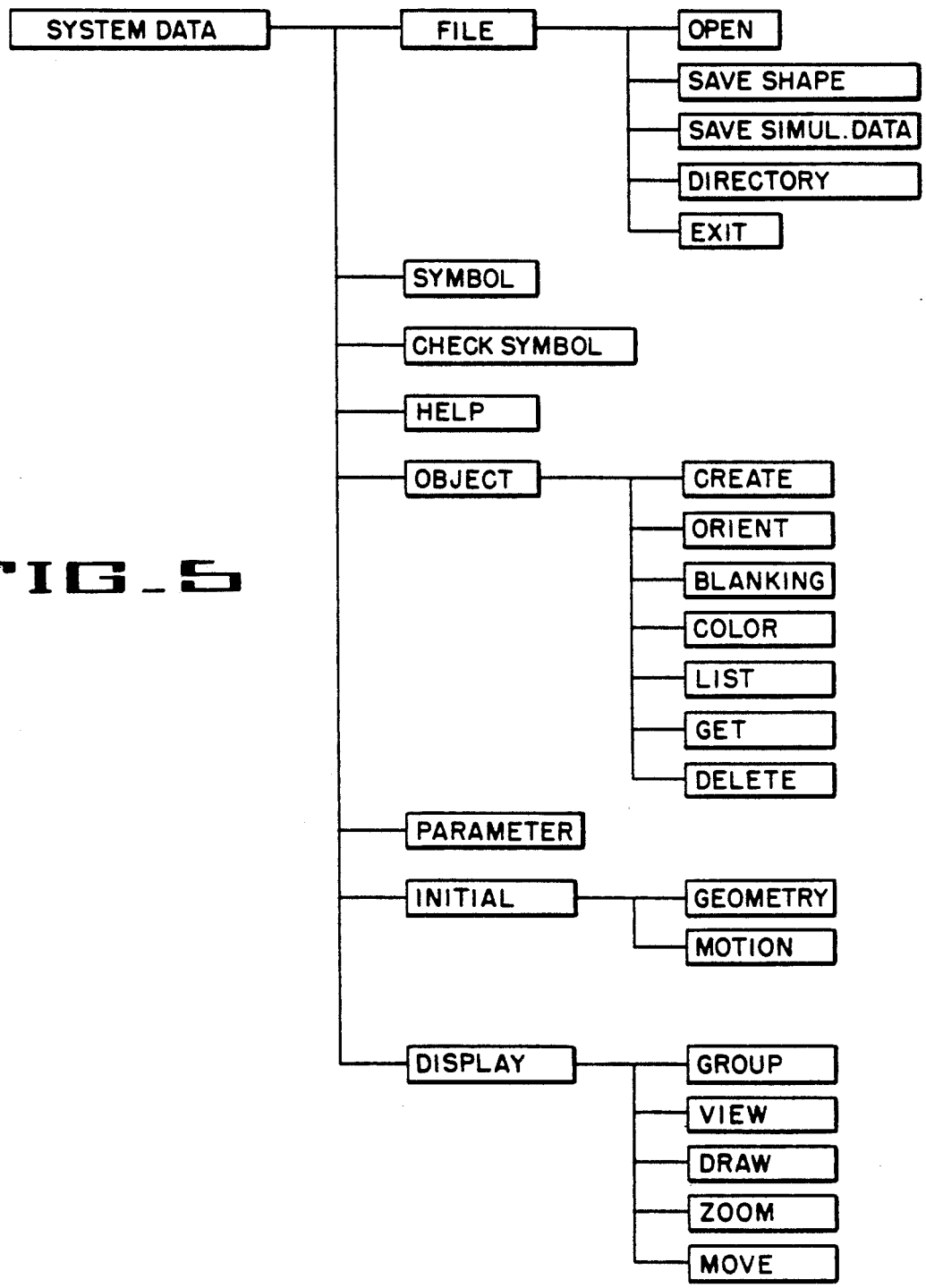
FIG_5

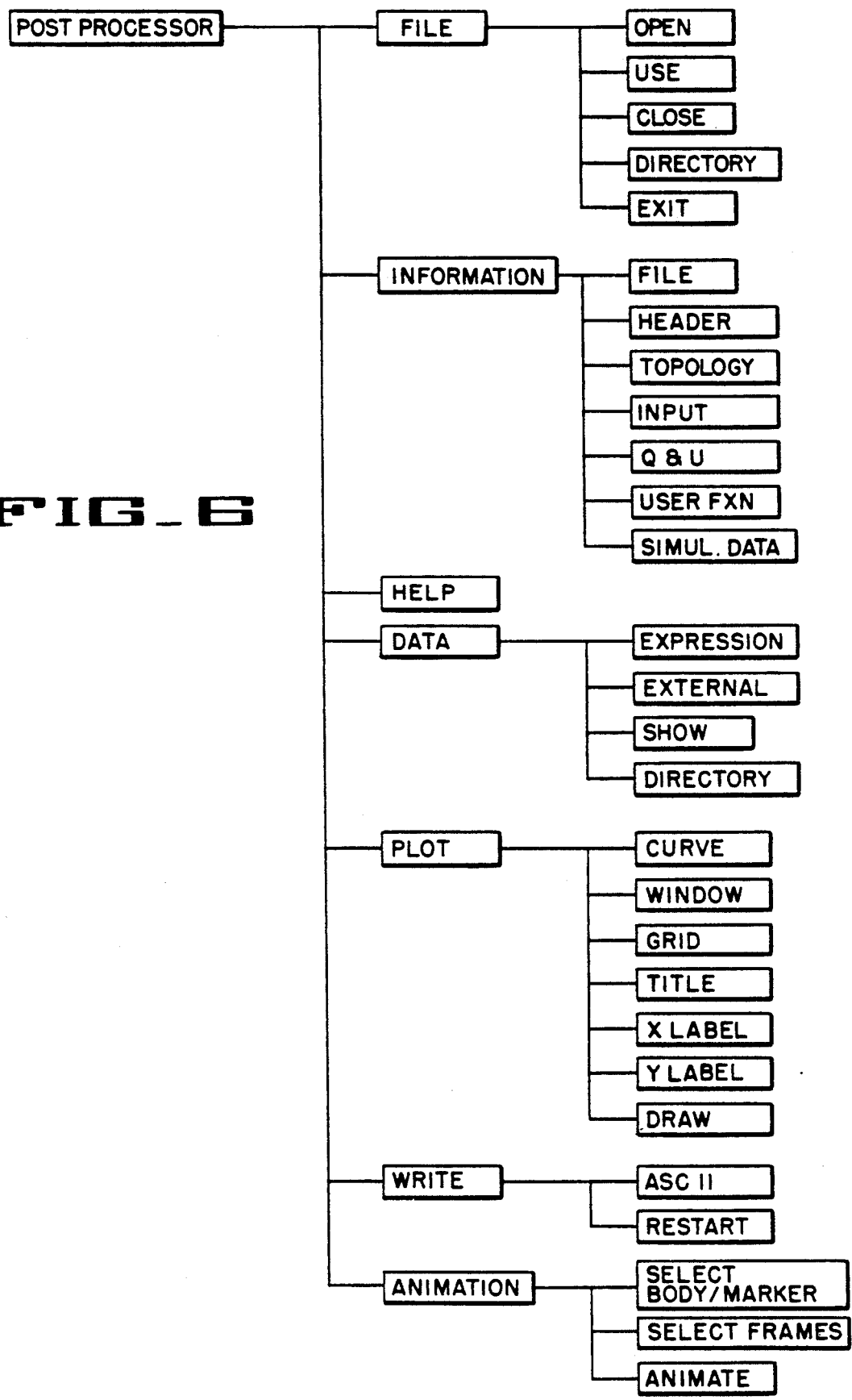
FIG_6

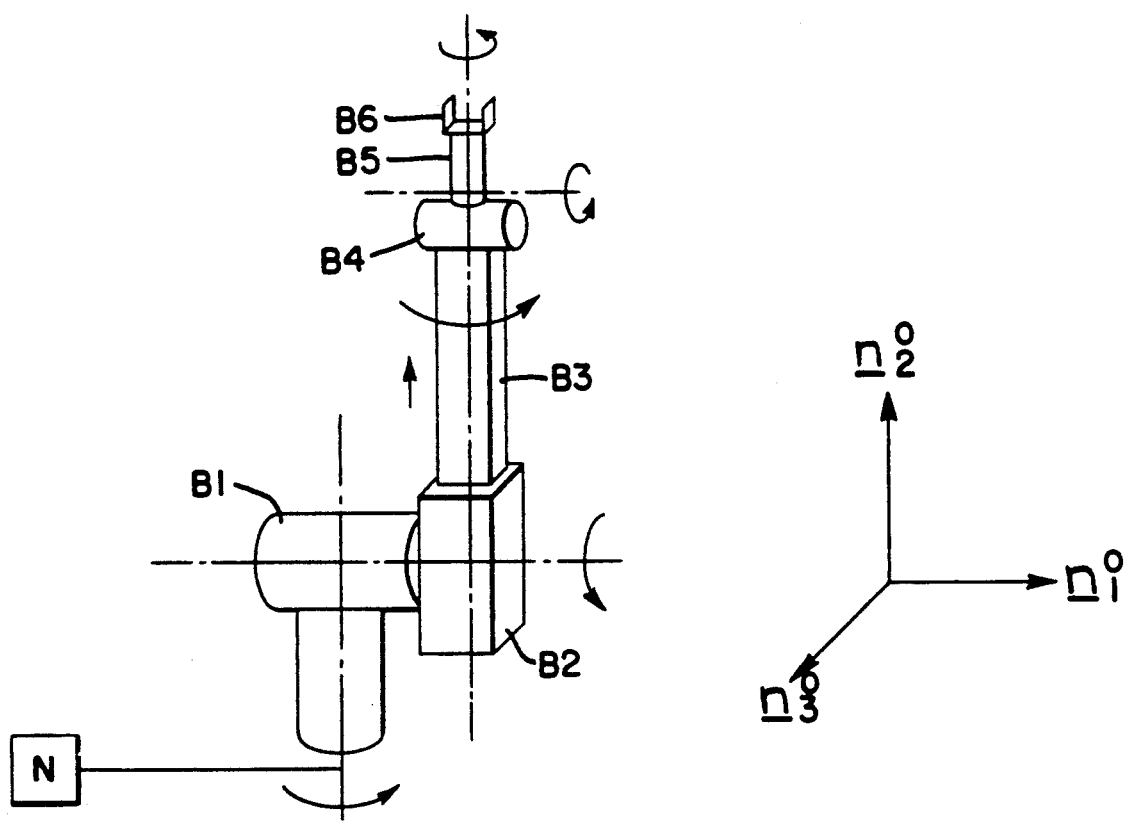
FIG_7

MULTI-BODY MECHANICAL SYSTEM ANALYSIS APPARATUS AND METHOD

This application is a continuation, of application Ser. No. 07/534,105, filed Jun. 5, 1990 now abandoned.

SUMMARY OF THE INVENTION

A method is disclosed for efficiently analyzing a holonomic, non-holonomic, or piecewise non-holonomic multi-body system which requires defining the topology of a general type of the multi-body system and generating symbolic equations representative of the equations of motion of the general multi-body system. Further, the method includes entering numerical values defining a specific multi-body system within the general type, simulating the operation of the multi-body system and obtaining the simulation results. The method includes checking for and indicating the acceptability of physical and system imposed restraints relative to the numerical values which have been entered and for refining those numerical values if necessary.

A method is disclosed for analyzing a mechanical system containing interconnected mechanical elements, which includes the operations of defining the basic topology of the mechanical system, selecting an inertially fixed reference frame for the mechanical system, specifying the mechanical system constraints and generating symbolic equations of motion for the constrained system for any holonomic, non-holonomic and piecewise non-holonomic dynamic system from the specified system constraints.

In another aspect of the invention apparatus is disclosed for analyzing a mechanical system having interconnected mechanical elements, which includes a preprocessor, data entry means for entering the mechanical system topology and constraints into the preprocessor, and means coupled to the preprocessor for formulating symbolic equations of motion for any holonomic, non-holonomic and piecewise non-holonomic constrained mechanical system based on the entered topology and constraints.

BRIEF DESCRIPTION OF THE DRAWINGS

FIG. 1A is a view of a multi-body mechanical system subject to analysis by the present invention.

FIG. 1B is a view of the multi-body mechanical system of FIG. 1A in disjointed condition.

FIG. 2 is a block diagram of the system of the present invention.

FIG. 3 is a block diagram of the preprocessor function in the disclosed system.

FIG. 4 is a diagram of a tree topology example display obtained from the preprocessor.

FIG. 5 is a block diagram of the functions performed by the system data module of the present invention.

FIG. 6 is a block diagram of the functions performed by the post processor of the present invention.

FIG. 7 is a view of another multi-body mechanical system subject to analyses by the present invention.

DESCRIPTION OF THE PREFERRED EMBODIMENTS

The system disclosed herein provides for motion and force analysis of mechanical systems of interconnected rigid bodies such as machines, robots, vehicles and space craft. The system as disclosed herein uses Kane's method for formulating the equations governing the motions of mechanical systems and the acting forces as described in "Dynamics: Theory And Applications", Thomas R. Kane and David A. Levinson, McGraw-Hill Book Company, Copyright 1985 (hereinafter Kane). Kane's method is coupled with symbolic computer algebra techniques to generate a specific simulation description for a given multi-body system. Reference may be made to the dissertation "Symbol Manipulation Computer Program Generating Equations Of Motion Of Mechanical System", Yi-Chung Chang, Ph.D. Dissertation, Stanford University Library, 1989.

A mechanical multi-body system may always be disjointed by breaking some connections between pairs of bodies in the system so that the system possesses a "tree", or open, topology. A multi-body mechanical system is shown in FIG. 1A wherein elements or bodies within the mechanical system are joined at pivot points 11 and 12 thus forming "closed loops" in the topology. The same system disjointed at pivot points 11 and 12 to form an open topology is shown in FIG. 1B. It is possible to have more than one "tree" in any one system. Degrees of freedom between any two adjacent elements or bodies within the system can be introduced by specifying generalized coordinates and generalized speeds regarding relative position and motion between those two bodies. The total number of the generalized coordinates is equal to that of the generalized speeds. Therefore, the system is holonomic. The required formulations for simulation of a holonomic multi-body system will be described hereinafter. If the system has been disjointed as shown in FIG. 1A in order to produce a "tree" topology, constraints can be imposed on the relative position or motion between any two bodies within the system that have been disconnected during the disjointing process to bring the connection back into being. By doing this, the generalized speeds are no longer independent and thus the system becomes non-holonomic. The formulations for simulation of a non-holonomic multi-body system are also described hereinafter. Further, by imposing different sets of constraints on a "tree" topology described system, a piecewise multi-body system may be described, the formulations for which are discussed hereinafter as well. Three types of simulation can be performed by the invention disclosed herein, depending on the holonomic and/or non-holonomic degrees of freedom of the multi-body system. Included are kinematical simulation, inverse kinematical simulation and dynamical simulation, also discussed in greater detail hereinafter. An energy check function is devised to provide a high level of confidence in the obtained numerical results from these various simulations. This check function will also be described in greater detail hereinafter. A "tree" topology multi-body system contains $\mu$ rigid bodies Bi, $(i=1, \ldots, \mu)$ which will be defined as connected to a previously defined body or an inertial reference N. Bo, as seen in FIG. 1B may be used to represent the inertial reference N. Thus, N or Bo is always the root of the tree topology. The tree may be defined by an array j(i) of dimension $\mu$ and j(i) is the subscript number of the body to which body Bi is connected. For example, the j(i) array of the multi-body system in FIG. 1B is as follows when the multi-body elements are designated as shown in FIG. 1B.

| i | 1 | 2 | 3 | 4 | 5 | 6 | 7 | 8 |
|---|---|---|---|---|---|---|---|---|

-continued

| j | 0 1 2 3 2 5 6 6 |
|---|---|

$B_i$ has a mass of $m_i$ and a central inertia dyadic of $I_i$. The configuration and motion of $B_i$ relative to $B_j$ can be specified by an equal number of generalized coordinates $q_r$ and generalized speeds $u_r$. After specifying $q_r$ and $u_r$ for all $B_i$'s where i extends from one through $\mu$, there exists a total number of $q_r$ and therefore $u_r$, of n. The mechanical system is then said to possess n degrees of freedom. Let $B_i^*$ and $B_j^*$ be the mass centers of $B_i$ and $B_j$. Let $(n_{i1}, n_{i2}, n_{i3})$ and $(n_{j1}, n_{j2}, n_{j3})$ be two sets of orthogonal unit vectors fixed in $B_i$ and $B_j$ and both sets coincide with $(n_1, n_2, n_3)$, a set of orthogonal unit vectors fixed in N (or $B_o$). The foregoing is to exist when all $q_r$'s are equal to zero. Note that for j equals zero, $B_o^*$ is a point fixed in $B_o$ and the unit vectors $n_{o1}, n_{o2}, n_{o3}$ fixed in $B_o$ are equal to the unit vectors fixed in N. If we further let $\hat{B}_i$ and $\hat{B}_j$, be two particles fixed on $B_i$ and $B_j$ respectively and instantaneously coinciding with each other then the configuration and motion of $B_i$ relative to $B_j$ are given in terms of $q_r$ and $u_r$ as follows:

$P^{ij}$ is a position vector from $B_j^*$ to $\hat{B}_j$ in $B_j$ basis.
$P^{ii}$ is a position vector from $\hat{B}_j$ to $B_i^*$ in $B_i$ basis.
$^jC^i$ is a direction cosine vector from $(n_1^j, n_2^j, n_3^j)$ to $(n_1^i, n_2^i, n_3^i)$.
$V^{rel}$ is the relative velocity between $\hat{B}_i$ and $\hat{B}_j$ which is $V^{\hat{B}_i - \hat{B}_j}$ in $B_i$ basis.
$^jW^i$ is the angular velocity of $B_i$ relative to $B_j$ in $B_i$ basis.

If j equals zero, then $\hat{B}_o$ is a point not necessarily instantaneously fixed in N, and its velocity is given by $V^o$ which is the velocity of $\hat{B}_o$ in N basis or reference frame.

Further, the relationship between $u_r$ and $\dot{q}_r$ (the time derivative of $q_r$) is given through the matrices $Y_{rs}$ and $Z_r$ as follows:

$$u_r = \sum_{s=1}^{n} Y_{rs} \dot{q}_s + Z_r \quad (r = 1, \ldots, n)$$

There are $\alpha_i$ forces $F^{ik}$ ($k = 1, \ldots, \alpha_i$) acting on body $B_i$ at point $p^{ik}$ and torques $T^i$ acting on body $B_i$. These quantities are defined as follows:

$F^{ik}$ is a force expressed in $B_i$ basis or N basis.
$P^{ik}$ is a position vector from $B_i^*$ to $P^{ik}$
$T^i$ is a torque expressed in $B_i$ basis or N basis.

Kinematics involve position, orientation, partial velocity, partial angular velocity, acceleration and angular acceleration of each element or body and the expressions for the time derivatives of $q_r$ in terms of $u_r$ and $q_r$ ($r = 1, \ldots, n$). These quantities related to a body $B_i$ are obtained by summing the quantities for $B_j$ and the "relative" quantities between $B_i$ and $B_j$ following the "tree" topology order from root to branches. The r partial velocities, $V_r$, or partial angular velocities, $\omega, r$, are the coefficients of the $u_r$ terms in the associated velocity of the expressions, while the partial velocity with respect to t ($V_t$ or $\omega t$ is the remainder of that expression. The following relationships apply:

Direction cosine matrix from $(n_1, n_2, n_3)$ to $(n_1^i, n_2^i, n_3^i)$;

-continued $$^oC^i = {^oC^j} \cdot {^jC^i} \tag{1}$$

Position of $B_i^*$;

$$P^i = P^j + {^oC^j} \cdot P^{ij} + {^oC^i} \cdot P^{ii} \tag{2}$$

Partial angular velocity of body $B_i$;

$$W_r^i = {^iC^j} \cdot W_r^j + {^jW_r^i} \quad (r = 1, \ldots, n) \tag{3}$$

in $B_i$ basis $$W_t^i = {^iC^j} W_t^j + {^jW_t^i} \tag{4}$$

in $B_i$ basis $$W^i = {^iC^j} \cdot W^j + {^jW^i} \tag{5}$$

in $B_i$ basis

Partial velocity of $B_i^*$;

If $j \neq 0$ then $$V_r^i = (V_r^j)_N + {^iC^j} \cdot [L(V_r^j) - W_r^j \times P^{ij}] + \tag{6}$$
$$W_r^i \times P^{ii} + V_r^{rel}$$

$(V_r^j)_N$ in N basis, other terms in $B_j$ basis $$V_t^i = (V_t^j)_N + C^j \cdot [(V_t^j)_L W_t^j \times P^{ij}] + \tag{7}$$
$$W_t^i \times P^{ii} + V_t^{rel}$$

$$V_t^j = (V_t^j)_N + (V_t^j)_L, N \text{ and } B_j \text{ basis resp'y.}$$

$$V^i = V^j + {^oC^j} \cdot (W^j \times P^{ij}) + {^oC^i} \cdot (W^i \times P^{ii} + V^{rel}) \tag{8}$$

in N basis.

or $j = 0$;

$$V_r^i = V_r^o + W_r^i \times P^{ii} + V_r^{rel} \tag{9}$$

$V_r^o$ in N basis, other terms in $B_i$ basis $$V_t^i = V_t^o + W_t^i \times P^{ii} + V_t^{rel} \tag{10}$$

$$V^i = V^o + {^oC^i} \cdot (W^i \times P^{ii} + V^{rel}) \tag{11}$$

in N basis.

Angular acceleration of $B_i$;

$$\alpha_i = {^iC^j}\alpha^j + W^i \times {^jW^i} + \frac{^id}{dt}({^jW^i})/u_r \tag{12}$$

in $B_i$ basis,

Total angular acceleration, $$\alpha_T^i = \alpha^i + \sum_{r=1}^{n} W_r^i \cdot \dot{u}_r \tag{13}$$

in $B_i$ basis.

Acceleration of $B_i^*$; if $j \neq 0$, $$a^i = (a^j)_N + {^iC^j} [(a^j)_L + W^j \times (W^j \times P^{ij}) + \alpha^j \times P^{ij}] + \tag{14}$$
$$W^i \times (W^i \times P^{ii}) + \alpha^i \times P^{ii} + 2 \cdot W^i \times V^{rel} + \frac{^id}{dt}(V^{rel})/u_r$$

$(a^j)_N$ in N basis, other terms in $B_j$ basis.

$\frac{^id}{dt}(V^{rel})/u_r$ is time differentiation of $V^{rel}$ in $B_i$ basis, excluding the contribution from $u_r$, time derivative of $u_r$.

Total acceleration,

-continued $$a_T{}^j = a^i + \sum_{r=1}^{n} V_r{}^j \cdot \dot{u}_r \text{ in } N \text{ basis} \tag{15}$$

If $j = 0$, $$a^i = \frac{{}^N d}{dt}(V^O) + W^i \times (W^i \times P^{ii}) + \alpha^i \times P^{ii} + \\ 2 \cdot W^i \times V^{rel} + \frac{{}^i d}{dt}(V^{rel}) \tag{16}$$

$\dot{q}_r$ in terms of $u_r$ and $q_r$, using $$[W_{rs}] = [Y_{rs}]^{-1} \tag{17}$$

$$\{X_r\} = [W_{rs}] \cdot \{Z_r\} \tag{18}$$

and, $$\dot{q}_r = \sum_{s=1}^{n} W_{rs} u_s + X_r \tag{19}$$

The dynamical equations can be written in the following format:

$$[M_{rs}] \cdot \{\dot{u}_r\} = \{R_r\} \tag{20}$$

In the forgoing [Mrs] is a n x n matrix. $\{\dot{U}r\}$ is a n x 1 matrix containing ur, which is the time derivative of ur, and $\{Rr\}$ is a n x 1 matrix. The kinematical quantities to which reference has just been made hereinbefore are used to construct M and R.

M is the system mass matrix.

$$M_{rs} = \sum_{i=1}^{\mu} [m_i V_r{}^i \cdot V_s{}^i + W_r{}^i \cdot (I^i \cdot W_s{}^i)] \tag{21}$$

where $m_i$ is mass of body $B_i$.

$V_r{}^i$, $V_s{}^i$ from eqns. (6) or (9).

$I^i$ $I^i$ is inertia dyadic of body $B_i$ as, $$I^i I^i = I^i_{11} n_1{}^i n_1{}^i + I^i_{22} n_2{}^i n_2{}^i + I^i_{33} n_3{}^i n_3{}^i + \\ I^i_{23}(n_2{}^i n_3{}^i + n_3{}^i n_2{}^i) + I^i_{31}(n_3{}^i n_1{}^i + n_1{}^i n_3{}^i) + I^i_{12}(n_1{}^i n_2{}^i + n_2{}^i n_1{}^i) \tag{22}$$

$W_r{}^i$, $W_s{}^i$ from eqn. (3)

R is the right side of the dynamical eqns.

First find resultant force $F_i$ and resultant moment $T_i$ about mass center of all forces acting on each body $B_i$ by using, $$F_i = \sum_{k=1}^{\alpha_i} F^{ik} \text{ in } N \text{ basis or } B_i \text{ basis} \tag{23}$$

$$T_i = T^i + \sum_{k=1}^{\alpha_i} P^{ik} \times F^{ik} \tag{24}$$

in $N$ basis or $B_i$ basis

Then construct inertia torque, excluding the contribution from $\dot{u}_r$, of each body $B_i$, $$T_i^* = I^i \cdot \alpha^i + W^i \times (I^i \cdot W^i) \text{ in } B_i \text{ basis} \tag{25}$$

$I^i$ $I^i$ is inertia dyadic of $B_i$, eqn. (22)

$\alpha^i$ is from eqn. (12)

Obtain $R_r$ by, $$R_r = \sum_{i=1}^{\mu} [V_r{}^i \cdot (-m_i a^i + F_i) + W_r{}^i \cdot (T_i - T_i^*)] \tag{27}$$

$V_r{}^i$ from eqn (6) or (9)

$m_i$ mass of body $B_i$ $a^i$ from eqn (14) or (16)

$F_i$ from eqn (23)

$W_r{}^i$ from eqn (3)

$T_i$ from eqn (24)

$T_i^*$ from eqn (25)

The constraint force on body Bi means the resultant force and the resultant moment about a point, fixed either in Bi or Bj (the body to which Bi is connected from the "tree" topology), that needs to be exerted on Bi by Bj in addition to the given active forces and torques to produce the motion solutions for the system. The problem is stated as follows. If the motions of the system, all active forces and torques, a body Bij, and a point Pci fixed either on Bi or Bj expressed in terms of a position vector Pc from Bi* or Bj* to the point of interest in the body fixed basis, are all given, then it remains to find Fci, constraint force acting on Bi by Bj in those bases or references, and Ici, constraint torque acting on Bi by Bj in basis. To solve this problem the following procedures are undertaken:

1. Find all bodies, including $B_i$, that are on the tree branches of $B_i$. There are then a total number of NTR bodies whose numbers are stored in the array ITR (k) where $k = 1, \ldots, NTR$.

2. $F_c{}^i = \sum_{k=1}^{NTR} (ma_T - F)_{ITR(k)}$ (30) in $N$ basis, where index $ITR(k)$ applies to $m$, $a_T$ and $F$.
$m_{ITR(k)}$ is mass of body $B_{ITR(k)}$.
$a_T{}_{ITR(k)}$ is obtained from equation (15).
$F_{ITR(k)}$ from equation (23) resolved in $N$ basis.

3. If $P_c{}^i$ is fixed on $B_i$, then ${}^OP_c{}^i$, position of $P_c{}^i$ is
$${}^OP_c{}^i = P^i + {}^OC^i \cdot P_c \tag{28}$$
in $N$ basis where $P^i$ is from eqn. (2) and ${}^OC^i$ is from eqn. (1), or If $P_c{}^i$ is fixed on $B_j$, then
$${}^OP_c{}^i = P^j + {}^OC^j \cdot P_c \tag{29}$$

4. $T_T^*$ for all bodies specified in $ITR(k)$ array
$$(T_T^*)^i = I^i \alpha_T{}^i + W^i \times (I^i \cdot W^i) \tag{31}$$
in $B_i$ basis where
$I^i$ is the inertia dyadic from eqn. (24).
$\alpha_T{}^i$ is from eqn. (13).
$W^i$ is from eqn. (5).

5. $T_c{}^i = \sum_{k=1}^{NTR} [T_T^* - T + (P - {}^OP_c{}^i) \times (ma_T - F)]_{ITR(k)} \tag{32}$ in $N$ basis, where index $ITR(k)$ applies to
$T_T^*$, $T$, $P$, $m$, $a_T$ and $F$.
$(T_T^*)^{ITR(k)}$ is from eqn. (31)
$T_{ITR(k)}$ is from eqn. (24)
$P^{ITR(k)}$ is from eqn. (2)

Once a "tree" topology multi-body system has been defined, constraints may be imposed on the system to produce a multi-body system with either configuration or motion constraints. Configuration and motion constraints are defined as follows. It should be noted that these two types of constraints relate to constraints on the relative configuration or motion between two bodies. A more general type of constraint which may be used to constrain system motions will be discussed hereinafter. A configuration constraint is defined through the following quantities.

Two bodies $B_i$ and $B_k$
Two position vectors appearing as $P_i^G$, $P_k^H$ in $B_i$ basis and $B_k$ basis respectively. $P_i^G$ is the position vector from $B_i^*$ to a point $G$ and $P_k^H$ is the position vector from $B_k^*$ to a point $H$. These two vectors are functions of $q_r$ and $t$, or constants. A unit vector $b$ fixed in $B_i$ or $B_k$ expressed in $B_i$ or $B_k$ basis.
A time function $f_T$ defined as:
$$f_T \triangleq (^N P^G - {}^N P^H) \cdot b \qquad (33)$$
where $f_T$ is or may be a constant; $^N P^G$ and $^N P^H$ are positions of $G$ and $H$, respectively in $N$.

A motion constraint may be defined through the following quantities:

Two bodies $B_i$ and $B_k$
Two position vectors $P^G$, $P^H$. $P^G$ is from $B_i^*$ to a point $G$ and can be decomposed into two components $P_i^G$ and $P_{ii}^G$, each expressed in $B_i$ basis and $B_{ii}$ basis. $B_{ii}$ is a body in the system other than $B_i$.
$$P^G = P_i^G + P_{ii}^G \qquad (34)$$
similarly,
$$P^H = P_k^H + P_{kk}^H \qquad (35)$$
A unit vector $b$
Constant components.
A time function $f_T$ defined as:
$$f_T \triangleq (V^G - V^H) \cdot b \qquad (36)$$
where $V^G$ and $V^H$ are velocities of points $G$ and $H$ respectively assuming they are instantaneously fixed in $B_i$ and $B_k$ respectively.

A general constraint may be specified by providing coefficients $A_r$ ($r=1,\ldots,n$) and $B$, as functions of time and $q_r$ of the following non-holonomic constraint equation.

$$\sum_{r=1}^{n} A_r u_r + B = 0 \qquad (37)$$

Upon imposing all the foregoing constraints, which amount to $m$ constraint equations, the system possesses $p$ degrees of freedom where $p=n-m$. (38)

The following kinematical derivation is for the purpose of generating a constraint equation of the form given by equation (37) for each of the configuration or motion constraints and, by differentiations, to generate the associated constraint equation in $\dot u_r$ and quantities $D$ such that $$\sum_{r=1}^{n} A_r \dot u_r + D = 0 \qquad (39)$$

where $D$ may be expressed as $$D = \sum_{r=1}^{n} \dot A_r u_r + \dot B \qquad (40)$$

By combining these equations for all constraints, the total constraint equations may be formed in a matrix format.

$$[A_{er}]\{u_r\} + \{B_e\} = 0 \qquad (41)$$

$$[A_{er}]\{\dot u_r\} + \{D_e\} = 0 \qquad (42)$$

In equations (41) and (42) $[A_{er}]$ is an $m \times n$ matrix, $\{u_r\}$ and $\{\dot u_r\}$ are $n \times 1$ matrices containing $u_r$ and $\dot u_r$, and $[B_e]$ and $[D_e]$ are $m \times 1$ matrices. The configuration constraints are explicitly expressed in terms of $q_r$ and $t$ to facilitate determination of a set of $q_r$ and $t$ that satisfy these configuration constraint equations.

$$^N P^G = P^i + {}^o C^i \cdot P_i^G \qquad (43)$$

$$^N P^H = P^k + {}^o C^k \cdot P_k^H \qquad (44)$$

where $P^i$, $P^k$ from eqn (2)
$^o C^i$, $^o C^k$ from eqn (1)
Then apply eqn (33) to form configuration constraint eqn explicitly in terms of $q_r$ and $t$, $$g(q_r, t) = 0 \qquad (45)$$

Next obtain associated motion constraint eqn. in form of eqn. (37) and (39), $$V_r^G = V_r^i + W_r^i \times P_i^G + \left[\frac{^i d}{dt}(P_i^G)\right]_r \qquad (46)$$

in $N$ basis or $B_i$ basis.
$V_r^i$ from eqn (6) or (9).
$W_r^i$ from eqn (3)

$\left[\dfrac{^i d}{dt}(P_i^G)\right]_r$ is $r^{th}$ partial velocity of $\dfrac{^i d}{dt}(P_i^G)$ which is time derivative of $P_i^G$ in $B_i$ reference in $B_i$ basis. Eqn (19), etc.

$$V_t^G = V_t^i + W_t^i \times P_i^G + \left[\frac{^i d}{dt}(P_i^G)\right]_t \qquad (47)$$

in $N$ basis or $B_i$ basis.
$V_t^i$ from eqn. (7)
$W_t^i$ from eqn. (4)

$\left[\dfrac{^i d}{dt}(P_i^G)\right]_t$ is velocity remainder of $\dfrac{^i d}{dt}(P_i^G)$ $$V_r^H = V_r^k + W_r^k \times P_k^H + \left[\frac{^k d}{dt}(P_k^H)\right]_r \qquad (48)$$

$$V_t^H = V_t^k + W_t^k \times P_k^H + \left[\frac{^k d}{dt}(P_k^H)\right]_t \qquad (49)$$

$$V^G = V^i + W^i \times P_i^G + \frac{^i d}{dt}(P_i^G) \qquad (50)$$

$V^i$ in $N$ basis or $B_i$ basis from eqn (8) or (11).
$W^i$ from eqn (5), and $$V^H = V^k + W^k \times P_k^H + \frac{^k d}{dt}(P_k^H) \qquad (51)$$

$$a^G = a^i + \alpha^i \times P_i^G + W^i \times \qquad (52)$$

$$\left[W^i \times P_i^G + 2\frac{^i d}{dt}(P_i^G)\right] + \frac{^i d^2}{dt^2}(P_i^G)/u_r$$

$a^i$ in $N$ basis or $B_i$ basis.
$a^i$ from eqn (14) or (16).

-continued $a^i$ from eqn (12)
$W^i$ from eqn (5), then as well $$a^H = a^k + \alpha^k \times P_k^H + W^k \times \left[ W^k \times P_k^H + 2\frac{k_d}{dt}(P_k^H) \right] + \frac{k_d^2}{dt^2}(P_k^H)/ur \tag{53}$$

Let $b = i$ if $b$ is fixed in $B_i$ and $b = k$ if $b$ is fixed in $B_k$, then $$A_r = b \cdot \left[ V_r^G - V_r^H - W_r^b \times ({}^NP^G - {}^NP^H) \left[ \frac{df_T}{dt} \right]_r \right] \tag{54}$$

$V_r^G$ from eqn (46)
$V_r^H$ from eqn (48)
$W_r^b$ from eqn (3)
${}^NP^G, {}^NP^H$ from eqns (43) and (44).

$$B = b \cdot [V_t^G - V_t^H - W_t^b \times ({}^NP^G - {}^NP^H)] - \left[ \frac{d}{dt}(f_T) \right]_t \tag{55}$$

$$D = b \cdot [a^G - a^H - 2W^b \times (V^G - V^H) - \alpha^b \times (P^G - P^H) + W^b \times (W^b \times ({}^NP^G - {}^NP^H))] - \frac{2d}{dt^2}(f_T)/ur \tag{56}$$

These are the constraint equations in the form of eqns (37) and (39).

The following describes how a set of qr and t is obtained that satisfies all of the configuration constraints. If L be the total number of configuration constraints, then all configuration constraints may be combined to obtain:

$$q_e(q_r, t) = 0 \quad (e = 1, \ldots, L) \tag{57}$$

$$[A_{er}]\{u_r\} + B_e = 0 \quad (r = 1, \ldots, n) \tag{58}$$

To demonstrate the use of the Newton-Raphson method for solving the nonlinear equation set of equations (57) it is assumed that the first L qr's are unknowns whose values are to be solved and the remainder of the qr's have fixed known quantities. The following matrix is obtained:

$$[J_{er}] \triangleq \left[ \frac{\partial g_e}{\partial q_r} \right] \quad (e, r = 1, \ldots, L) \tag{59}$$
$$= \{[A_{er}] \cdot [Y_{rs}]\} \text{ first } L \text{ columns}$$

wherein [Yrs] is a n x n matrix defined in the relationship for between qr hereinbefore. With equations (57), (59) and an initial guess of the values of qr (r=1, ..., n) the solution for qr (r=1, ..., L) by the Newton-Raphson method is enabled.

The derivation of the motion constraint equations follows.

$$V_r^G = V_r^i + W_r^i \times P^G \tag{60}$$

in $N$ basis or $B_i$ basis $V_r^i$ is from eqn (6) or (9)

$W_r^i$ is from eqn (3)

$D^G$ is from eqn (2) in $B_i$ basis, and $$V_t^G = V_t^i + W_t^i \times P^G \tag{61}$$

$$V_r^H = V_r^k + W_r^k \times P^H \tag{62}$$

$$V_t^H = V_t^k + W_t^k \times P^H \tag{63}$$

$$V^G = V^i + W^i \times P^G \tag{64}$$

where $V^i$ in $N$ basis or other terms in $B_i$ basis.

$V^i$ from eqn (8)

$W^i$ from eqn (5), and $$V^H = V^k + W^k \times P^H \tag{65}$$

$$a^G \triangleq \frac{N_d}{dt}(V^G)/ur \tag{66}$$

$$= a^i + W^i \times \left[ W^i \times P_i^G + \frac{i_d}{dt}(P_i^G) + W^{ii} \times P_{ii}^G + \frac{ii_d}{dt}(P_i^G) \right] + \alpha_i \times P^G$$

$a_i$ in $N$ basis other terms in $B_i$ basis $\frac{N_d}{dt}(V^G)/ur$ is time derivative of $V^G$, velocity of $G$ assuming $G$ fixed instant. in $B_i$, in $N$.

$a^i$ is from eqn (14) or (16)

$W^i$, $W^{ii}$ are from eqn (5)

$P_i^G, P_{ii}^G$ from eqn (34)

$\frac{i-d}{dt}(P_i^G)$ time derivatives of $P_i^G$ in $B_i$ in $B_i$ basis $\frac{ii_d}{dt}(P_{ii}^G)$ time derivatives of $P_{ii}^G$ in $B_{ii}$ in $B_{ii}$ basis.

$\alpha^i$ from eqn (12), and $$a^H \triangleq \frac{N_d}{dt}(V^H)/ur \tag{67}$$

$$= a^k + W^k \times \left[ W^k \times P_k^H + \frac{k_d}{dt}(P_k^H + W^{kk} \times P_{kk}^H + \frac{kk_d}{dt}(P_{kk}^H) \right] + \alpha^k \times P^H$$

$$A_r = b \cdot [V_r^G - V_r^H] - [f_t]_r \tag{68}$$

$b$ from eqn (36)

$V_r^G$ from eqn (60)

$V_r^H$ from eqn (62)

$$B = b \cdot [V_t^G - V_t^H] - [f_T]_t \tag{69}$$

$$D = b \cdot [a^G - a^H - W^b \times (V^G - V^H)] - \frac{d}{dt}(f_T)/ur + \frac{d^b}{dt} \cdot [V^G - V^H] \tag{70}$$

$a^G$, $a^H$ from eqns (66) and (67).

-continued $W^b$ from eqn (5).

$V^G$, $V^H$ from eqns (64) and (65).

Since Ar and B are given in this case as functions of qr and t, it is only necessary in the case of the general constraint to find D through the relationship:

$$D = \sum_{r=1}^{n} \frac{d}{dt}(Ar) \cdot ur + \frac{d}{dt}(B) \quad (71)$$

where $$\frac{d}{dt}(Ar) = \sum_{s=1}^{n} \frac{\partial Ar}{\partial qs} \cdot \dot{q}s + \frac{\partial Ar}{\partial t} \quad (72)$$

$$\frac{d}{dt}(B) = \sum_{s=1}^{n} \frac{\partial B}{\partial qs} \cdot \dot{q}s + \frac{\partial B}{\partial d} \quad (73)$$

The dynamical equations are the combination of the holonomic dynamical equations, those for the "tree" topology system before constraints are imposed, with the addition of the contribution from the Lagrange multiplier λe associated with each constraint, and the totality of the constraint equations. These equations may be rewritten from equation (20), with the contribution from λe, and equations (41) and (44) as:

$$[M]\{\dot{u}\} = \{R\} + [A]^T\{\lambda\} \quad (74)$$

$$[A]\{u\} + \{B\} = 0 \quad (75)$$

$$[A]\{\dot{u}\} + \{D\} = 0 \quad (76)$$

In equations (74), (75) and (76) M is a n x n matrix, R is a n×1 matrix, Lambda is a m×1 matrix, A is a m x n matrix, and B and D are m×1 matrices. It should be again noted that n represents the holonomic degrees of freedom of the mechanical system and m is the total number of constraints placed on the system. The non-holonomic degrees of freedom p is therefore p = n minus m as seen in equation (38).

To simplify the discussions, it is assumed that the first pur's, denoted as uI, are chosen to be independent generalized speeds, and the remaining mur's are denoted by uD and are dependent generalized speeds. Matrix A may therefore be decomposed into two parts, AI and AD and equations (75) and (76) may be written as follows:

$$[A_I \, A_D]\begin{pmatrix} u_I \\ u_D \end{pmatrix} + \{B\} = 0 \quad (77)$$

$$[A_I \, A_D]\begin{pmatrix} \dot{u}_I \\ \dot{u}_D \end{pmatrix} + \{D\} = 0 \quad (78)$$

In similar fashion, M and R may be decomposed and equation (74) may be rewritten as follows.

$$\begin{bmatrix} M_I & M_{ID} \\ M_{ID}^T & M_D \end{bmatrix} \begin{pmatrix} \dot{u}_I \\ \dot{u}_D \end{pmatrix} = \begin{pmatrix} R_I \\ R_D \end{pmatrix} + \begin{bmatrix} A_I^T \\ A_D^T \end{bmatrix} \{\lambda\} \quad (79)$$

The following statement of the problem may be made. If M, R, A, B, D, and uI are given, then uD, ùI (to be integrated), ùD (to be used for calculating accelerations only), and λ may be found.

The following discussion of the solution for this mathematical problem will be divided in two categories. The first category deals with a dynamical case, i.e., p is not equal to zero. The second category deals with a kinematical case in which p is equal to zero. In the dynamical case where p is not equal to zero, the matrices for Ac, Bc, and Dc are constructed as follows:

$$A_c = -A_D^{-1} \cdot A_I \quad (80)$$

$$B_c = -A_D^{-1} \cdot B \quad (81)$$

$$D_c = -A_D^{-1} \cdot D \quad (82)$$

Ac is a m x p matrix and Bc and Dc are m x 1 matrices. Then obtain uD by the relationship:

$$\{u_D\} = [A_c]\{u_I\} + \{B_c\} \quad (83)$$

Construct the matrices for Mc (p x p) and Rc (p x 1) as follows:

$$M_c = M_I + M_{ID} \cdot A_c + (M_{ID} \cdot A_c)^T + A_c^T M_D A_c \quad (84)$$

$$R_c = R_I + A_c^T R_D - (M_{ID} + A_c^T M_D) \cdot D_c \quad (85)$$

then obtain ùI through the relationship:

$$\{\dot{u}_I\} = [M_c]^{-1}\{R_c\} \quad (86)$$

Obtain ùD through the relationship:

$$\{\dot{u}_D\} = [A_c]\{\dot{u}_I\} + \{D_c\} \quad (87)$$

Obtain λ through the relationship:

$$\{\lambda\} = A_D^{-T}[-R_D + (M_{ID}^T + M_D A_c)\dot{u}_I + M_D \cdot D_c] \quad (88)$$

Note that equation (86) represents the dynamical equations of the non-holonomic system.

In the kinematical category where p is equal to zero, A is a n x n matrix and all ur's are dependent variables. u and ù are obtained through the relationships:

$$\{u\} = -A^{-1} \cdot B \quad (89)$$

$$\{\dot{u}\} = -A^{-1} \cdot D \quad (90)$$

λ is obtained through the relationship:

$$\lambda = A^{-T} \cdot [-R + M \cdot \dot{u}] \quad (91)$$

All ùr's will not be integrated, but will only be used to obtain acceleration information.

The constraint forces for a non-holonomic system are of two types of forces or torques. The first type includes the force required to maintain each constraint imposed on the "tree" topology system described hereinbefore. These forces are related to the Lagrange multipliers. The second type of constraint force is the constraint force or torque existing between two adjacent bodies in the "tree" topology. However, these forces and torques must be modified to include the contribution from the first type of constraint forces or torques. In the case of a constraint force from the constraint equations, no additional computation is required. It is only a matter of how the Lagrange multiplier is interpreted as obtained from equations (88) or (91) as interaction forces between the two bodies whose relative motion is constrained through the constraint equations. This physical interpretation is possible only for configuration and motion constraints, but not possible for a general constraint.

For a configuration constraint, the Lagrange multiplier $\lambda$ may be interpreted as follows: If b is fixed in Bi, $\lambda$ is the measurement number of the action-reaction force acting on Bi by Bk at point H in the b direction. Alternatively, if b is fixed in Bk, $\lambda$ is the measurement number of the action-reaction force acting on Bi by Bk at point G in the b direction. If fT in the configuration constraint is a function of qr, then there is an additional generalized constraint force associated with this $\lambda$ which cannot be physically interpreted. For a motion constraint, the Lagrange multiplier is interpreted as the measurement number of the force acting on Bi by Bk at point G in the b direction and minus $\lambda$ is interpreted as the measurement number of the force acting on Bk by Bi at point G in the b direction. If fT in the motion constraint is a function of ur then there is also a generalized constraint force associated with this $\lambda$ which cannot be physically interpreted.

The solution procedures stated hereinbefore for constraint forces are valid except that Fi and Ti must be modified before applying equations (30) and (32). This modification is for the purpose of explicitly accounting for the contribution from the Lagrange multiplier $\lambda$. As stated hereinbefore, there is no physical interpretation of $\lambda$ for a generalized constraint, so those $\lambda$ contribute implicitly to the constraint force calculations. Each configuration constraint must, therefore, be modified as follows:

if b is fixed in $B_i$:

$$F_i \leftarrow F_i + \lambda b \quad (92)$$

$$F_k \leftarrow F_k - \lambda b \quad (93)$$

$$T_i \leftarrow T_i + (^N P^H - P^i) \times (\lambda b) \quad (94)$$

$$T_k \leftarrow T_k + P_k^H \times (-\lambda b) \quad (95)$$

if b is fixed in $B_k$:

$$F_i \leftarrow F_i + \lambda b \quad (96)$$

$$F_k \leftarrow F_k - \lambda b \quad (97)$$

$$T_i \leftarrow T_i + P_i^G \times (\lambda b) \quad (98)$$

$$T_k \leftarrow T_k + (^N P^G - P^k) \times (-\lambda b) \quad (99)$$

For each motion constraint modification is necessary as follows:

$$F_i \leftarrow F_i + \lambda b \quad (100)$$

$$F_k \leftarrow F_k - \lambda b \quad (101)$$

$$T_i \leftarrow T_i + P^G \times (\lambda b) \quad (102)$$

$$T_k \leftarrow T_k + P^H \times (-\lambda b) \quad (103)$$

To this point three ways of imposing constraints on a "tree" topology multi-body mechanical system have been introduced to obtain a simple non-holonomic multi-body system. A piecewise multi-body system may be defined by imposing only part or a "subset" of the total constraints on the "tree" topology system at a time, and thus providing np different non-holonomic systems. Since these non-holonomic systems are provided by imposing different sets of constraint equations on the same "tree" topology system, the name "piecewise multi-body system" is used to designate the collection of these different systems. This collection of systems may then be gathered in a single simulation program for analysis. If kinematics and dynamics have already been derived for the "tree" topology multi-body system and Ar, B and D have been constructed for each constraint (configuration, motion or general), then it is only necessary to collect a set of Ar, B and D according to which constraints are to be imposed and to form the matrices [Aaer], {Be} and {De} as defined in equations (41) and (42) for the non-holonomic piece in questions at any instant in time. The solution equations (74) through (91) may then be applied to any non-holonomic piece.

To perform the simulation of a piecewise multi-body mechanical system, two additional items of information are required. The first item is how the analysis system can determine which piece to simulate at the current time. This involves the determination of the initial piece to be used and the criteria for switching from one piece to another. The second required item of information is what the analysis system should do at this transition if the configuration or motion of the system just before transition does not satisfy the configuration or motion constraints after switching to the new piece for simulation. In the simulation system, these two items of information are provided by the mechanical system modeler.

The energy check function is performed as follows:

Let $Gr, Qr, S, \dot{Z}, K_2$ and $K_0$ be defined as:

$$Gr = \sum_{i=1}^{u} [V_r^i \cdot F_i + W_r^i \cdot T_i] \ (r = 1, \ldots, n) \quad (104)$$

$V_r^i$ from eqns (6) or (9)

$F_i$ from eqn (23)

$W_r^i$ from eqn (3)

$T_i$ from eqn (24)

$$Qr = \begin{cases} 0 \text{ if } m = 0 \\ \sum_{s=1}^{m} A_{sr} \cdot \lambda_s \text{ if } m \neq 0 \end{cases} \quad (105)$$

$A_{sr}$ from eqn (41)

$\lambda$ from eqn (88) or (91)

$$S = \sum_{i=1}^{u} \left[ m_i V^i \cdot \frac{N_d}{dt}(V_i^i) + W_i \cdot II_i \cdot \frac{N_d}{dt}(W_i^i) \right] \quad (106)$$

$m_i$ is mass of body $B_i$ $V^i$ from eqns (8) or (11)

$\frac{N_d}{dt}(V_i^i)$ is time derivative in $N$ of $V_i^i$ from eqns (7) or (10)

$W^i$ from eqn (5).

$II_i$ is inertia dyadic of $B_i$ from eqn (22)

-continued $\frac{N_d}{dt} (W_i^j)$ is time derivative in $N$ of $W_i^j$, eqn (4)

$$Z = - \sum_{r=1}^{n} (Gr + Qr) \cdot ur + S \tag{107}$$

$$K_2 = \frac{1}{2} \{ur\}^T \cdot [M] \cdot \{ur\} \tag{108}$$

$ur$ is generalized speed $M$ is holonomic mass matrix eqn (21)

$$K_0 = \frac{1}{2} \sum_{i=1}^{\mu} [m_i V_i^j \cdot V_i^j + W_i^j \cdot II_i \cdot W_i^j] \tag{109}$$

$m_i$ is mass of body $B_i$ $V_i^j$ from eqns (7) or (10)

$II_i$ is inertia dyadic of $B_i$ $W_i^j$ from eqn (4)

The energy check function E is defined as: (See Journal of Applied Mechanics, September 1988, Volume 55, page 711, as modified March 1990 Volume 57, page 248.)

$$E = Z + K2 - K0 \tag{110}$$

In equation (110) Z is the integration of $\dot{Z}$ given in equation (107). Integration of $\dot{Z}$ should be accompanied with the integration of $\dot{u}r$ ($\nu = 1, \ldots, n-m$) and $\dot{q}r$ ($\nu = 1, \ldots, n$). If E fails to remain constant, the simulation results are incorrect. If E remains constant, this does not guarantee simulation validity, but it is regarded as an indicator of correctness.

Kinematical simulation indicates that no generalized coordinates qr or generalized speeds ur have been introduced in defining the "tree" topology multi-body mechanical system. In other words, n=zero. In this case only $\dot{Z}$ in equation (107) will be integrated in the computer energy check function E. It should be noted that the quantities in equation (108) and the summation of $$\sum_{r=1}^{n} (Gr + Qr) \cdot ur$$

in equation (107) are equal to zero. In addition since $Vi = Vi$, the energy check function E given in equation (110) becomes $$E = \int \sum_{L=1}^{\mu} \left[ m_i V^i \cdot \frac{N_d}{dt}(V^i) + W^i \cdot II_i \cdot \frac{N_d}{dt}(W^i) \right] \cdot dt - \frac{1}{2} \sum_{L=1}^{\mu} [m_i V^i \cdot V^i + W^i \cdot II_i \cdot W^i] \tag{112}$$

Inverse kinematical simulation indicates that the total number of qr introduced in the "tree" topology mechanical system is equal to the total number of constraints. In other words, n=m. The system, therefore, has zero degrees of freedom, i.e., p=zero. In such a case, only $\dot{q}r$ ($\nu = 1, \ldots, n$) obtained from equation (19) and Z obtained from equation (107) will be integrated. ur and $\dot{u}r$ (r=1, ..., n) are obtained by using equations (89) and (90) respectively and $\lambda r$ is obtained through equation (91). Body motions are obtained through equations (1), (2), (5), (8), (11), (13), and (15) at each time step and quantities Fi and Ti (i=1, ..., u) will be computed using equations (23) and (24) and equations (92) through (103) to facilitate constraint force evaluation as hereinbefore described.

Dynamical simulation of a mechanical multi-body system means that after imposing constraints, if any, the multi-body system has non-zero degrees of freedom, i.e., p=n−m greater than zero. Dynamical simulation may be divided into two categories: (1) "tree" topology system (m=0); and (2) multi-body system with constraints (m not equal to zero). For both cases $\dot{q}r$ shown in equation (19) and $\dot{Z}$ shown in equation (107) will be integrated. Body motions are calculated using equations (1), (2), (5), (8), (11), (13) and (18) at each time step. In addition to these calculations, the following quantities will also be calculated. In the case of a "tree" topology system (m=zero), equation (20) will be solved for us and $\dot{u}r$ will be integrated to obtain ur ($\nu = 1, \ldots, n$). Fi and Ti (i=1, ..., $\mu$) is calculated using equations (23) and (24) at each printout time step to facilitate constraint force evaluation discussed hereinbefore. Regarding a system with constraints (m not equal to zero), $\dot{u}I$ from equation (86) is integrated to obtain uI. $\dot{u}D$ from equation (83), uD from equation (87) and $\lambda$ from equation (88) will be evaluated at each printout time step also. In addition, Fi and Ti (i=1, ..., $\mu$) will be computed using equations (23), (24) an (92) through (103) to facilitate constraint force evaluation discussed hereinbefore.

This system begins, as may be seen in FIG. 2 with an information input from a modeler, defined as an individual with relatively high level training in the characteristics and analysis of mechanical systems. The inputs are made to a preprocessor 13 through a keyboard or some other input device 14. The output from the preprocessor is connected to a symbolic generator 15 which acts as a transformer to generate new information. Certain files are generated by the symbolic generator appearing as simulation source codes and documentation 16. The output from module 16 of FIG. 2 is transmitted through media such as discs, tapes and printouts to a text editor and compiler 17. Other user inputs which may be input through the same or another keyboard 14 may be made by the modeler or by a user having familiarity with the specific mechanical systems being analyzed, but not necessarily the high level of understanding of mechanical systems possessed by the modeler. It should be noted that the media output by the simulation source code module 16 is self contained and portable and may be utilized on-site or off-site by a user or a modeler as desired and convenient. The output from the text editor and compiler 17 is coupled to a system data module 18, together with the user's input from keyboard 14. The system data module accepts symbols, initial conditions, and time parameters for simulation. The system data module can also access the animation capabilities of the post processor in order to preview the system geometry. System data module generated files are provided as input to the simulator 19. The files are provided to the simulation executable code 20 to provide the actual mechanical multi-body simulation. The simulation result data is passed on to a post processor 21 which is coupled to the user input keyboard 14 and the system data module 18. The post processor provides the capability for a user to manipulate simulation results data to generate files containing selected quantities in a user specified format at 22, plot xy data at 23 and animate simulation results at 24. The files, plots and animation 22, 23 and 24 respectively may be displayed in accordance with user requirements. The invention as practiced thus far has utilized C language inputs to the symbolic generator 15 and Fortran language outputs therefrom for the sake of convenience. Other languages may be used, although the best known mode at this time is as described.

Several terms should be defined to facilitate this disclosure. A symbol is defined as a character string containing, in this embodiment, at most 20 characters starting with a character of the alphabet or in numerical value. Any string starting with T is a string reserved for a symbol A time function is a function of time only and the name of a time function starts with the characters TT followed by at most 15 characters. A Q function is a function of time, generalized coordinates qi's and position or orientation of bodies. The name of a Q function starts with TQ followed by at most 15 characters. A sensor function is a function of time, generalized coordinates qi's, generalized speed ui's, position or orientation of bodies, velocity or angular velocities of bodies, or other defined sensor quantities. A sensor function is used to specify required kinematical quantities for control force determination. The name of a sensor function starts with TS followed by at most 15 characters. A force function is a function of time, generalized coordinates qi's and generalized speeds ui's. A force function is used to calculate forces or torques applied to the multi-body system during simulation. The name of a force function starts with TF followed by at most 15 characters. A user defined function is any one of a time function, a Q function, a sensor function, or a force function which may be referred to as a user defined function if it is not explicitly defined in the preprocessor 13. D or DD will be added to the end of the string of a user defined function to designate the first or second time derivatives of the function.

The system receives input data in a symbolic or a numerical format from a keyboard or terminal 14 or from previously created data files. The input data is divided into four categories: (1) multi-body system definition data; (2) simulation data; (3) body shape data; and (4) expressions for post possessing. A multi-body system consists of bodies, joints, constraints, drivers, forces, sensors and piecewise information. All of this information is not applicable to every mechanical multi-body system. FIG. 1, hereinbefore described, is an example of a multi-body system subject to analysis by the analysis system and method disclosed herein. As previously described, a multi-body system may first be disjointed by a modeler for defining bodies such that it has a "tree" topology. The "loop" or motion constraints will be introduced by the modeler at a later time. While in the disjointed "tree" topology, the system must be brought to a reference configuration (all qi's =zero) and the three body fixed orthogonal unit vectors on each body must be defined so that in the reference configuration all bases coincide with each other. A body must be connected to another body with a joint upon definition. A joint library is provided by the system including the following joint types: bracket; free (six degrees of freedom joint); cylinder; planar; prismatic; revolute; screw; spherical; universal and user defined. To define a body a user must provide the following information: body name; mass; inertia; inboard body (name of the previously defined body or multi-body reference); joint; inboard to joint (position vector from inboard body mass center to joint in inboard body bases, three symbols); joint to body (position vector from joint to body mass center in body bases, three symbols). The constraint can be entered by a modeler to define "loop" topology and to impose motion constraints on the system. There are five types of constraints: position; velocity; gear one; cam one; and user defined. To define a constraint other than the user defined constraint, a user must provide the following information: name; type; body one name; body two name and parameters. The modeler, as mentioned hereinbefore, must be knowledgeable enough to know how the holonomic generalized speeds must be defined for the disclosed analyzing system. The modeler must supply the name of the constraint, the type of the constraint and the functions of qi's and time.

A driver is used to describe the time history of a generalized speed associated with the joint. Thus, a modeler must be familiar with how generalized speeds are defined and ordered for a joint. A modeler will supply the following information for a driver: name; joint name; the number of degrees of freedom; and the function. A library of force types will be provided by the system. Currently six types of forces are included in the library. A control force, for example, requires body one name, body two name, position vector from body one mass center to an intermediate point in body one bases and thence to point of application in body two bases (six symbols), position vector in body two mass center to an intermediate point in body two bases and thence of the point of application in body one bases (six symbols), name of force function, and direction of force on body two in body one or body two bases (three symbols). To define a force a user will specify the name of the force, the type of force, and the parameters such as recited for the control force herein.

The purpose of a sensor is to provide scalar kinematical quantities which are required for control force and torque evaluation. These quantities include position and velocity between two points fixed on two different bodies, and orientation and angular velocity between the two bodies. Modeler supplied parameters for computation of these quantities are required for each type of sensor. A translation sensor and a rotation sensor are envisioned. To specify a sensor a modeler must provide the name of the sensor, the type of sensor, body one name, body two name and the sensor parameters.

As discussed hereinbefore, to specify a piece-wise system, a modeler must provide a total number of "pieces" in the system. For each piece, the modeler is asked to provide a subset of constraints defined in the multi-body system. The interfaces to define criteria for transition between these pieces and how to make the transition will be provided by the symbolic processor to generate expressions for variables and parameters required for the transitions.

Simulation data includes numerical solution parameters, user defined subroutines and initial conditions and time parameters. Numerical solution methods are required for solving linear equations, ordinary diffential equations and nonlinear algebraic equations from geometric constraints. The parameters necessary for specification by a modeler for ordinary differential equations includes minimum integration step size, a tolerance, and selection of either fixed step or flexible step integration. Nonlinear algebraic equation parameters include the maximum number of iterations and the tolerance thereon. In the definition of multi-body system data, a modeler is allowed to specify the names of the functions instead of the explicit functions to describe constraints, drivers, forces and sensors. These functions are then calculated during simulation by calling a modeler defined subroutine. This subroutine is generated by the symbolic generator 15 and all functions are set to zero. A modeler must modify this subroutine to implement the functions. Finally, a user or modeler will specify initial conditions for q and u. The user will be provided with an equation solver to make sure that the specified initial q's satisfy geometric or loop constraints defined in the multi-body system data. Simulation start time, end time and printout step size are also specified by a user. In order to preview a multi-body system before simulation and to animate simulated motion after simulation, a user must define a geometric shape for each body. The shape will be provided by the user in a data file. The origin of each body is located at the mass center and the reference frame bases follow the one used in the reference configuration when the multi-body system is defined. For the user's convenience, a library of simple geometric shapes which include box, sphere, cylinder, cone, etc. are provided.

For post prossessing simulation data results, a user may perform mathematical operations on the results before plotting. For example, position, velocity, acceleration, vector, constraint quantities, etc. values may be obtained through instructions to the post processor 21.

The information generated by the disclosed system includes multi-body system definition data. Sufficient explanation of all data is provided. These data can also be read by the preprocessor 13 upon a modeler's request. Further explanation is provided of how generalized coordinates q and generalized speeds u are defined. It should be noted that if all q's are set equal to zero the multi-body system has the reference configuration used to define the system. Input is also defined to the system data module 18 is also defined by the preprocessor 13. This input contains a list of symbols whose values need to be assigned, and a list of user defined function names. In addition, input to the symbolic generator 15 is defined. Certain subroutines in the system programs are present to find the position and orientation of each body for a given time and q, compute the sum of the square of the residual of each geometric constraint for a given time and q, compute the gradient of the sum of the square of the residual of each geometric constraint with respect to user selected q's for given time and q, and compute user defined functions related to body position and orientation and geometric constraints. The input data files 19 of FIG. 2 include numerical values of all symbols, numerical solution parameters, initial conditions for simulation and time parameters, a map between program defined symbols and user specified symbols, a topology of the multi-body system before constraints, and a user supplied identification number to identify the simulation cases. The simulation results from the simulation executable code 20 include generalized coordinates q, generalized speeds u, time derivatives of u, Lagrangian multipliers, mass center position, velocity, and acceleration of each body, orientation, angular velocity, angular acceleration of each body, sum of all active forces on each body, including contribution from Langrangian multipliers, and user defined functions. The data files 22 include time history of user specified quantities. A data file for animation is included, together with a graphical representation of the multibody system to allow a user to visualize the system before simulation and to visualize how the system configuration changes when the values of q are changed. Further, this helps the user to select values of q as an initial guess for a solution of the geometric constraint equations. Graphic facilities in the post processor 21 are utilized for the display.

All of the modeler and the user data input into the system will be checked by the system itself. Symbols entered in the preprocessor 13 are checked against convention conflict. This includes words which are reserved for symbols, duplicate usage of names for the multi-body system elements, function name convention, and all multi-body element conventions described herein. Numbers entered into the preprocessor 13 and numeral values for symbols which are entered by a modeler or user into the system data module are checked according to the following rules:

1. Body mass must be greater than or equal to zero.
2. Body moments of inertia must be greater than or equal to zero.
3. The sum of any two moments of inertia of a body must be greater than or equal to the third one.
4. Cross moments of inertia must satisfy physical possibility requirements.
5. The magnitude of a direction vector must be equal to one.
6. All restrictions on parameters of a multi-body system element described herein must be followed.
7. Spring constants and damping constants must be greater than or equal to zero.
8. Constraints and drivers must be independent of each other.
9. Initial conditions must satisfy geometric constraint, motion constraint, and driver constraint.

Previously, information inputs have been defined and description of how information is transformed as it is processed by the system has been described. Now a description will be presented with regard to the commands or facilities which are supplied in each system module for a modeler or a user to define a multi-body system and to monitor execution of the system software to meet the simulation purposes. As previously described, the system contains five functional modules: preprocessor 13; symbolic generator 15; system data module 18; simulation modules 19 and 20; and post processor 21. A typical procedure for use by a modeler to implement the system functions includes the following:

1. Invoke preprocessor 13.
2. Define bodies and joints.
3. Define constraints.
4. Define drivers.
5. Define the piecewise system.
6. Define sensors and forces.
7. Save the input, and ask the system to generate input files to the symbolic generator 15.
8. Run the symbolic generator 15 to provide symbolic formats of the mechanical system equations of motion.

The modeler or a user then picks up the process which will follow in the following sequence:

1. Modification of modeler defined subroutines in the text editor.
2. Compiling and linking of simulation codes, which include modeler defined subroutines and position constraint subroutines in the compiler 17.
3. Invoking the system data module 18.
4. Defining the mechanical system body or element shapes.

5. Entering the numerical values for the symbols and invoking the data check facility to check the numerical values.

6. Preview the system.

7. Enter the initial values for q and check configuration.

8. Solve for initial values of q compatible with geometric constraints.

9. Enter initial values for independent u and check singularity.

10. Enter numerical solution parameters and simulation time parameters.

11. Save the body shapes and ask the system to generate input data file for dynamical simulation and post processor 21.

12. Run the simulation routines.

13. Invoke the post processor 21.

14. Enter a file name.

15. Enter expressions for mechanical system quantities of interest.

16. Plot the quantities of interest (23) and save the data in file (22).

17. Add the mechanical system points of interest for animation (24).

18. Select the mechanical system bodies for animation and enter the animation parameters.

19. Animate the simulation results and/or generate an animation data file.

A detailed description of the various system elements will now be undertaken. The preprocessor 13 allows a modeler to define a multi-body system and to subsequentially generate a Fortran (in this embodiment) code for data checking in the system data module 18 as well as an input file for the symbolic generator 15 based on the modeler input. The generated input file may also be read by the preprocessor at a later time for further modification thereto. The preprocessor command structure is shown in FIG. 3 as an outline of the preprocessor capabilities. The FILE function relates to size subfunctions. The first subfunction NEW discards the current model in the preprocessor, if any, and opens a modeler specified NEW file for building a new model. The INCLUDE subfunction appends the model from a modeler specified file to the current model, if any. The SAVE subfunction saves modeler input multi-body data. The SAVE and GENERATE allows the modeler to save the defined multi-body data relating to generalized coordinates and speeds symbols and generate input to the symbolic generator 15. DIRECTORY subfunction displays all files in the current preprocessor working directory.

The EDIT function allows selection of a mechanical system element prior to invoking one of the five subfunctions shown in FIG. 3. CREATE allows creation of a selected element. MODIFY allows change in parameter symbols and values of a previously defined element. DELETE allows deletion of a previously defined element. COPY allows copying of one element's parameters to another. VIEW allows visual inspection of all defined items of the selected element.

The HELP function provides help messages associated with a selected function or subfunction.

ELEMENT provides a selection of all available aspects for defining a mechanical multi-body system. Eight such selections are seen pending from the ELEMENT function in FIG. 3.

The ASSEMBLY function allows a check of the mechanical multi-body system definition and generates the generalized coordinates q and the generalized speeds u. CHECK TREE subfunction allows construction of a "tree" topology array of the defined model. DEFINE Q, U subfunction allows assignment of q and u to each joint variable following body and joint definitions. LIST Q, U allows display of the definition of q and u when no modification has been done after the last DEFINE Q, U. DUPLICATE SYMBOLS provides a list of all symbols that have been used more than once in the system definition and lists the mechanical system elements where they were used. SHOW SYMBOLS provides a list of all symbols that have been used in the mechanical system definition. SUMMARY provides a display of the total number of items that have been defined for each multi-body system element. If the definition of q and u is current, then a display is provided of the total number of q and the degrees of freedom of the multi-body system.

The DISPLAY function provides choice for the background display of the system. BODY TREE subfunction provides the "tree" topology of the system including the joint names. An example of the "tree" topology is shown in FIG. 4. If a joint name appears in a body definition, but has not been defined as a joint element the joint name will have an asterisk symbol before it. The symbol N always represents an inertial reference frame. The chain feature of the system is indicated in the horizontal direction and the branch feature is in the vertical direction of FIG. 4.

The purpose of the symbolic generator 15 is to read the data file generated by the preprocessor 13 and to generate a symbol/function list file, two subroutines were used by the system data module 18, and a simulation program in FORTRAN language.

The purpose of the system data module 18 is to provide modelers and users with means to enter numerical values of symbols, initial conditions, and time parameters for simulation. Physically impossible numerical values will be checked as described hereinbefore. The initial conditions will also be checked with regard to whether geometry and motion constraints are satisfied and, upon the modelers or users request, solutions of the constraint equations will be provided for the initial conditions of the modeler or user selected generalized coordinates and speeds. Kinematical singularity will also be detected and the system will automatically select independent generalized speeds to overcome the problem. The system allows a modeler or user to create body shapes and graphically display selected bodies. The position and orientation of each of these selected bodies may be changed according to the modeler or user entered values of generalized coordinates. The values of generalized coordinates may be changed by means of the keyboard 14 of FIG. 2, or other means if available. All calculations with regard to body position, body orientation, and constraint equations are performed in this embodiment utilizing FORTRAN codes generated by the symbolic generator 15. Therefore, the FORTRAN codes must be modified, if time prescribed kinematical functions need to be updated, and then compiled. The compiled object code can then be linked to the system data module 18. Alternatively, a modeler or user can link these FORTRAN objective does to build a stand alone executable code which can later be instituted by the system data module 18. This requires that the symbolic generator 15 generate a FORTRAN main program instead of mere subroutines.

The system data module 18 functions in the following fashion. A function FILE contains five subfunctions as seen in FIG. 5. Subfunction OPEN opens a file created by the symbolic generator 15, which stores all symbols and user functions that are used to define the mechanical multi-body system. Further, the previously generated simulation data file may be opened if specified and the previously generated body shape file may be opened if specified. SAVE SHAPE subfunction save the currently defined body shape in a file. SAVE SIMULATION DATA saves the currently defined simulation data, which includes symbol values, parameters, and initial conditions. This file is used as input to the simulation program. DIRECTORY subfunction displays all files with system data input/output file extension in the current directory. EXIT subfunction allows modeler or user to exit the system data module with confirmation on data which is unsaved.

The SYMBOL function allows a modeler or user to enter or modify numerical values of all listed symbols in a way similar to screen editing. Explanation of each symbol can be provided on screen upon the user's request.

CHECK SYMBOL allows all entered numerical values to be checked by calling the data checking subroutine generated by the preprocessor 13 as mentioned hereinbefore.

OBJECT allows creation of objects to define the shape of a mechanical system body. The body shape is used for display purpose and can be used for later animation of simulation results.

PARAMETER allows a modeler or user to enter or modify parameters related to accuracy of numerical solutions and simulation time.

INITIAL allows entry or modification of initial conditions of q and u in a way similar to screen editing.

GEOMETRY subfunction provides computation of geometric constraint equation residuals and modification of the values of user selected dependent q's that satisfy the geometric constraints if requested by the user.

MOTION subfunction allows computation of the motion constraint equation residuals and modification of the values of user selected dependent u's that satisfy the motion constraints upon the user's request.

DISPLAY function contains five subfunctions as seen in FIG. 5.

GROUP allows selection of the bodies from the mechanical system to be displayed.

VIEW provides a change in the viewing direction of the group.

DRAW allows the selected body to be drawn on the screen according to the initial conditions of the q's.

ZOOM allows the user or modeler to define a portion of a scene to be enlarged.

MOVE allows a modeler or user to select a generalized coordinate, and move the mechanical system according to a given increment of the value of the selected q upon the user's request through a mouse or the keyboard. Moreover, this subfunction allows a user to change the initial conditions to the current values.

The simulation code generated by the symbolic generator 15 and the simulation data generated by the system data module 18 are both required for simulation. A modeler or user must follow the following procedure for simulation.

1. Modify the subroutine generated by the symbolic generator 15 relating to forces and/or torques.

2. Compile and link the simulation code to generate an executable code.

3. Run the executable code.

The purpose of the post processor 21 is to allow a modeler or user to manipulate simulation result data, generate data files containing selected quantities in a user specified format, plot x-y data and animate the simulation results. The function of the post processor is depicted in FIG. 6 of the drawings. The FILE function relates to five subfunctions as seen in the drawing. OPEN subfunction provides opening of a simulation result file. USE activates a previously opened file. CLOSE closes a previously opened file. DIRECTORY displays all files with extensions related to the post processor. EXIT allows the process to leave the post processor. HELP function displays help messages associated with selected portions of the process.

The INFORMATION function relates to seven subfunctions. FILE allows display of the names of files that have been opened and marks the file that is currently in use. HEADER displays the header defined in the active simulation result file. TOPOLOGY displays the mechanical multi-body system topology in the same way as described hereinbefore for the preprocessor 13. INPUT subfunction displays the multi-body system definition. Q and U display the definition of the generalized coordinates and the generalized speeds. USER FUNCTIONS subfunction lists all of the names of the user defined functions. SIMULATION displays the numerical values of the symbols and the simulation parameters.

The DATA function relates to four subfunctions. EXPRESSION subfunction allows modelers and users to define their own variables, vector or scaler. EXTERNAL subfunction allows the modeler or user to define the variables by reading values from an external file. SHOW subfunction provides for display of numerical values of a variable within a modeler or user specified range of frames. DIRECTORY allows display of all modeler or user defined variables and their definitions.

PLOT function relates to seven subfunctions. CURVE subfunction allows the user to define curves to be plotted through screen editing. WINDOW subfunction allows the processor to select a window to cover all of the data and spread it out as large as possible. The user may also define a window and number of divisions in x and/or y. GRID subfunction allows a modeler or user to turn on and off grid lines. TITLE allows a modeler or user to specify a title. X LABEL and Y LABEL allows a user to specify a label. DRAW subfunction provides the drawing of the defined curves on a display screen.

WRITE function contains two subfunctions. ASCII allows modelers or users to write time histories of selected variable in a specified ASCII format. RESTART allows generation of an input file for simulation at a modeler or user specified restart time.

The ANIMATION function seen in FIG. 6 relates to three subfunctions. SELECT-BODY/MARKER subfunction provides for a modeler or user to select bodies or markers to be included in the animation. SELECT-FRAME subfunction allows a modeler or user to select a range of frames and those frames to be skipped during animation. ANIMATE starts animation on a display screen.

Validation performed by the system disclosed herein answers the question with regard to whether the calculations of the system have been successfully implemented. Certain performance limits are attached to the system as follows. The complexity and size of the mechanical multi-body system that may be handled depends on available memory. In the preferred embodiment described herein and in accordance with the best mode known, the system is limited to fifty mechanical system bodies or elements, one hundred generalized coordinates (holonomic degrees of freedom), one hundred constraints and drivers, one hundred user defined functions, and six hundred symbols. These numbers serve as a target complexity and do not necessarily reflect the constraints due to the memory size of a particular computer system.

Input data from modelers and users through the preprocessor 13, system data module 18 and post processor 21 is checked against convention conflicts, physically impossible arrangements or properties, and oversize of the defined mechanical multi-body system.

The software developed to run the analysis system described herein is portable to any computer system with a UNIX operating system, a standard C compiler, and driver/library for PHIGS (or X-WINDOW). The generated simulation program, as mentioned hereinbefore, is portable on-site or off-site to any analysis system disclosed herein having a standard FORTRAN-77 compiler.

By way of example of the operation of the disclosed analysis system, reference is made to FIG. 7 of the drawings. FIG. 7 shows a robot arm known as the Stanford arm consisting of six elements or bodies designated B1, B2, B3, B4, B5 and B6. B1 may be rotated in a Newtonian reference frame N about a vertical axis n2 fixed in both N and B1, and B1 supports B2, which may be made to rotate relative to B1 about a horizontal axis affixed in both B1 and B2. B3 is supported by B2, and may be made to perform translational motion relative to B2 while carrying B4, which may be made to rotate relative to B3 about an axis fixed in both B3 and B4. B5 is connected to B4, and B6 is connected to B5 in such a way that each can be made to rotate relative to the body that supports it, about an axis affixed in both the supporting and the supported bodies.

To run the FORTRAN program for the Stanford Arm a modeler first needs to generate an executable code and then create a data file containing the following information or instructions:

1. A description of the run (in one line).
2. The numerical values of the following parameters (system dimensions of interest):

```
   L1, L2, L3, L4, L5, L6, MA,
   IA1, IA2, MB, IB1, IB2, IB3, MC,
   IC1, IC2, MD, ID1, ID2, ME, IE1,
   IE2, MF, IF1, IF2, IF3, G, K
3. The initial values of
   Q1, Q2, Q3, Q4, Q5, A6
4. The initial values of
   U1, U2, U3, U4, U5, U6
5. The choice of integration method.
   1: Fixed time step.
   2: Flexible time step.
6. The simulation starting time and ending
   time.
7. The integration time step.
8. k: results will be printed every k
   integration time steps.
Example 1 (in system data module):
1 2 3 4 5 6 7
8 9 10 11 12 13 14
15 16 17 18 19 20 21
22 23 24 25 26 27 28
0 0 0 0 0 0
1 1 1 1 1 1
2
0 5 0. 1 1
SYSTEM PARAMETERS (simulation codes/
documentation echo of input):
L1      0.100000D+00
L2      0.100000D+00
L3      0.700000D+00
L4     −0.100000D+00
L5      0.000000D−01
L6      0.140000D+00
MA      0.900000D+01
IA1     0.100000D−01
IA2     0.200000D−01
MB      0.600000D+01
IB1     0.600000D−01
IB2     0.100000D−01
IB3     0.500000D−01
MC      0.500000D+01
IC1     0.400000D+00
IC2     0.100000D−01
MD      0.100000D+01
ID1     0.500000D−03
ID2     0.100000D−02
ME      0.600000D+00
IE1     0.500000D−03
IE2     0.200000D−03
MF      0.500000D+00
IF1     0.100000D−02
```

```
-continued
IF2        0.200000D−02
IF3        0.300000D−02
G          0.981000D+01
K          0.000000D+00
INITIAL CONDITION:
Q1   0.
=
Q2   0.
=
Q3   0.
=
Q4   0.
=
Q5   0.
=
Q6   0.
=
U1   0.
=
U2   0.
=
U3   0.
=
U4   0.
=
U5   0.
=
U6   0.
=
FLEXIBLE TIME STEP INTEGRATION (echo of
instructions):
STARTING TIME = 0.
ENDING TIME = 5.00000
INTEGRATION TIME STEP = 0.100000 SEC
RESULT PRINTED EVERY K STEPS; k = 1 (EVERY 0.1 SEC HERE)
OUTPUT SELECTIONS:
SYSTEM DESCRIPTION
MASS CENTER POSITION IN GLOBAL
EACH BODY ORIENTATION IN GLOBAL
MASS CENTER VELOCITY IN GLOBAL
EACH BODY ANG-VEL IN LOCAL
ACCELERATION IN GLOBAL
ANGULAR ACCELERATION IN LOCAL
SIMULATION CHECKING
ACTIVE FORCE IN GLOBAL AND TORQUE IN LOCAL
TIME HISTORY OF Q
TIME HISTORY OF U
TIME HISTORY OF UD
ANIMATION FILE, TOPOLOGY INFORMATION
ORIGINAL NUMERICAL USER INPUT FILE
```

Although the best mode contemplated for carrying out the present invention has been herein shown and described, it will be apparent that modification and variation may be made without departing from what is regarded to be the subject matter of the invention.

What is claimed is:

1. A method of efficiently analyzing a holonomic, non-holonomic or piecewise non-holonomic multi-body system, comprising the steps of disjoining as many of the multi-body system connections as necessary to form an open tree topology system, defining constraints imposed on the open tree topology multi-body system to define the type of system being analyzed, placing the multi-body system definition information in a preprocessor memory, describing the general multibody system in the preprocessor in accordance with the definition in memory, generating portable and self-contained symbolic equations representative of the equations of motion of the general multi-body system in a symbolic generator, entering numerical values into the symbolic equations, thereby defining a specific multi-body system within the general type, simulating the operation of the multi-body system in a simulator, obtaining outputs descriptive of the multi-body system from the simulator, and checking for and indicating acceptability of physical and system imposed restraints relative to the numerical values entered in the simulator.

2. The method of claim 1 wherein the step of defining constraints imposed on the open tree topology comprises the step of defining combinations of constraint equations which apply at different times to define a piecewise non-holonomic dynamic system.

3. The method of claim 1 comprising the step of determining proper system initial conditions.

4. The method of claim 1 comprising the step of storing the time history of the simulation results.

5. The method of claim 1 comprising the step of plotting the obtaining simulation results in two dimensional format, whereby an overview of a large amount of information is provided.

6. The method of claim 1 comprising the step of animating the motions of the multi-body system, whereby intuitive visual information is provided.

7. The method of claim 1 wherein the step of simulating system operation comprises the step of solving ordinary differential equations and investigating the solution integration results to determine integration accuracy and correctness of the symbolic equation formulation.

8. The method of claim 1 comprising the step of manipulating the simulation results to obtain various system quantities of interest.

9. The method of claim 8 comprising the step of storing the time history of the system quantities of interest.

10. A method for analyzing a mechanical system containing interconnected mechanical elements, comprising the steps of
defining the basic topology of the mechanical system,
disjoining as many of the system mechanical elements as necessary to form an open tree system topology,
defining constraint equations to be imposed to convert the open tree topology into the defined basic topology,
defining at least one subset of the restraint equations to be applied to the mechanical system during analysis,
placing the defined information in a preprocessor memory,
describing the basic mechanical system in the preprocessor in accordance with the information in memory,
selecting an inertially fixed reference frame for the mechanical system, and
generating symbolic equations of motion for the constrained system in a symbolic generator for any holonomic, non-holonomic and piecewise non-holonomic dynamic system from the system definition and specified system constraints.

11. The method of claim 10, comprising the step of
prescribing the time history of a generalized speed associated with a joint between elements in the mechanical system.

12. The method of claim 10, comprising the step of defining the force types acting on the mechanical members.

13. The method of claim 10, comprising the step of specifying scaler kinematic quantities for evaluation of contributions from system force and torque to the dynamical equations.

14. The method of claim 10, comprising the step of checking for and indicating acceptability and correctness of the generated symbolic equations considering system convention and restrictions.

15. The method of claim 10, comprising the step of creating a stand-alone executable code providing portability for delayed execution on site and off site.

16. The method of claim 10, comprising the step of determining the constraint forces acting on the mechanical members.

17. The method of claim 10, comprising the steps of
entering numerical values for symbols and initial conditions into the symbolic equations to obtain system specific equations of motion, and
solving the system specific equations of motion in a simulator to obtain simulator outputs descriptive of body position, orientation and constraints.

18. The method of claim 11 comprising the step of storing the time history of the simulation results.

19. The method of claim 17 comprising the step of plotting the simulator outputs in two dimensional format, whereby an overview of large amounts of information is obtained.

20. The method of claim 17 comprising the step of animating the motions of the mechanical system, whereby intuitive visual information is obtained.

21. The method of claim 17 comprising the step of manipulating the simulation results to obtain predetermined system quantities of interest.

22. The method of claim 21 comprising the step of storing the time history of the system quantities of interest.

23. Apparatus for generating a simulation program for analyzing a mechanical system having interconnected mechanical elements therein, comprising
a preprocessor including a memory,
means for disjoining multi-body system mechanical elements to form an open tree system topology,
data entry means for entering into said preprocessor memory mechanical system open tree topology and constraint equations necessary to convert the open tree topology into the system to be analyzed, and
a symbolic generator coupled to said preprocessor memory for formulating symbolic equations of motion for any holonomic, non-holonomic and piecewise non-holonomic constrained mechanical system based on the entered open tree topology and constraints, thereby providing a portable simulation program output for a general type of the multi-body system.

24. Apparatus as in claim 23 comprising means for validating mechanical system topology and constraints considering system convention and physical possibilities.

25. Apparatus as in claim 23, comprising a system data module for receiving said symbolic equations and for entering symbol numerical values and initial conditions into said equations of motion,
a simulator for simulating the equations of motion with the entered numerical values and initial conditions and for obtaining simulation results indicative of mechanical element position, orientation and constraint equations.

26. Apparatus as in claim 25 comprising a postprocessor for manipulating the simulation results, whereby predetermined system quantities of interest are obtained.

27. Apparatus as in claim 25 comprising a postprocessor for plotting the simulation results in two dimensional format.

28. Apparatus as in claim 25 comprising a postprocessor for animating the mechanical element motions.

29. Apparatus as in claim 25 wherein said preprocessor comprises means for selecting at least one subset of said constraint equations to be applied to the mechanical system during analysis as a function of simulation results and simulation control.

30. Apparatus as in claim 25 comprising means for validating symbol numerical values and initial conditions considering system convention and physical possibilities.

31. Apparatus for analyzing a mechanical multi-body system having interconnected mechanical elements, comprising a preprocessor for storing the definition of the multi-body system in open tree format, multi-body system members, joints and constraints means for defining and storing at least one constraint subset which is to be applied to the multi-body system during analysis as a function of simulation results and simulation control, a symbolic generator for receiving the stored definitions from the preprocessor and for providing symbolic formats of the multi-body system equations of motion, means connected to receive said symbolic formats for compiling the linking simulation codes, a system data module connected to said means for compiling for defining multi-body system element shapes and for entering numeric values for symbols in the symbolic formats, simulator means connected to said system data module for analyzing the equations of motion and providing output indicative thereof, and a post processor for receiving said simulator means output and for formatting simulation result data.

* * * * *